United States Patent [19]

Banks

[11] Patent Number: 5,043,573
[45] Date of Patent: Aug. 27, 1991

[54] ELECTRO-OPTIC POWER CELL

[75] Inventor: Frank Banks, Leucadia, Calif.

[73] Assignee: Moog Inc., East Aurora, N.Y.

[21] Appl. No.: 366,610

[22] Filed: Jun. 15, 1989

[51] Int. Cl.$^5$ .............................................. H01J 5/16
[52] U.S. Cl. .................................. 250/227.24; 385/33
[58] Field of Search ..................... 250/227.23, 227.24, 250/211 R, 211 J, 226; 136/246, 257; 350/96.18, 96.20

[56] References Cited

U.S. PATENT DOCUMENTS

| 3,790,791 | 2/1974 | Anderson | 250/227.24 |
| 3,792,284 | 2/1974 | Kaelin | 250/227.24 |
| 3,950,075 | 4/1976 | Cook et al. | 350/96.18 |
| 4,182,545 | 1/1980 | Greer | 250/227.24 |
| 4,186,995 | 2/1980 | Schumacher | 350/96.18 |
| 4,223,216 | 9/1980 | Quick et al. | 250/227.23 |
| 4,255,015 | 3/1981 | Adams et al. | 350/96.20 |
| 4,354,115 | 10/1982 | Warabisako et al. | 136/246 |
| 4,539,476 | 9/1985 | Donuma et al. | 350/96.18 |
| 4,822,998 | 4/1989 | Yokota et al. | 250/226 |

Primary Examiner—David C. Nelms
Assistant Examiner—Khaled Shami
Attorney, Agent, or Firm—Frank D. Gilliam

[57] ABSTRACT

An electro-optic power cell for transducing incoming light energy from an optical fiber into electrical energy through a photo diode. An optical fiber extends into a first housing through a wall thereof. A lens in the housing abuts and is sealed to the end of the optical fiber to expand the light beam from the fiber and direct it to a photo diode in engagement with the output end of the lens. A second housing which contains an electrical socket is fastened to the first housing. Leads from the photo diode are connected to the electrical socket so that the electrical signal from the photo diode can be connected to an external electric receptacle. The optical path is hermetically sealed to prevent entry of contaminants. Several embodiments of the photo diode are described in order to perform different functions. One embodiment uses a segmented photo diode having the segments connected in series to increase diode output voltage. Another uses two photo diode segments covered by different bandpass filters so that each responds to a different wavelength of incoming light. The diode segments can be connected to a load with opposite polarity, so that forward to reverse operation may be selected by selecting the wavelength of light conveyed by the optical fiber.

10 Claims, 1 Drawing Sheet

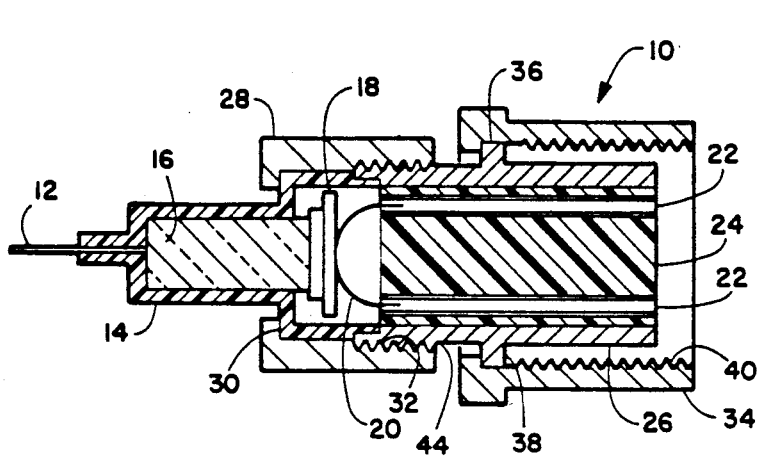
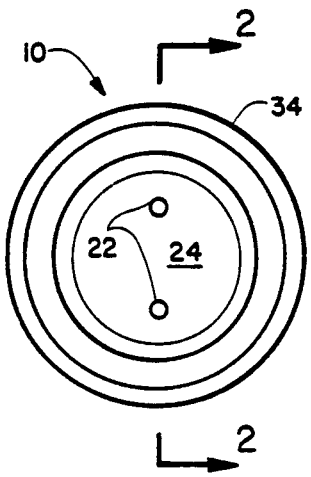
FIGURE 2
FIGURE 1
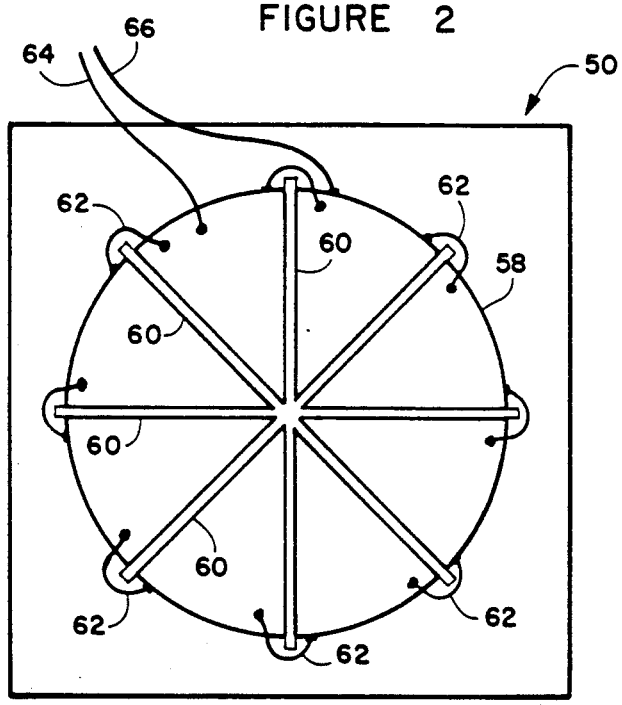
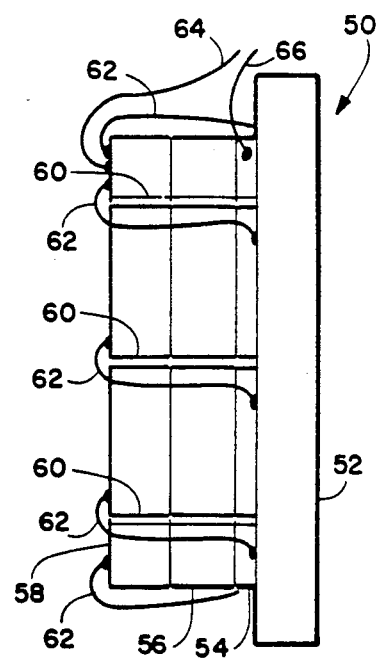
FIGURE 3
FIGURE 4
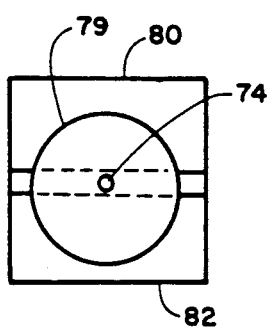
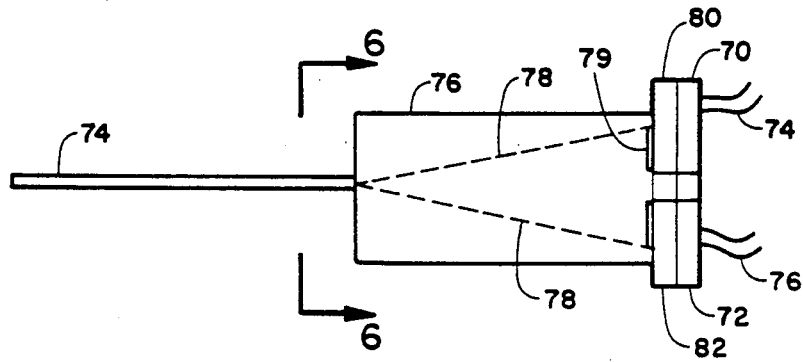
FIGURE 6
FIGURE 5

ELECTRO-OPTIC POWER CELL

BACKGROUND OF THE INVENTION

This invention relates in general to device useful in remotely controlled actuation systems and, more specifically, to an electro-optic power cell for use in a fiber optic system for controlling remote electrical devices.

In the past, devices such as aircraft to ship control surfaces, valves, machines and the like were generally controlled from a distance by mechanical linkages or hydraulic systems. While these systems are effective, they are heavy, occupy considerable space and redundant control paths for safety are difficult to provide.

Recently, systems have come into use which use electrical signals passing through wires from input means to control devices. These systems are much lighter in weight, occupy little space and provide redundant wiring paths to protect against loss of control if one wire is damaged. These so-called "fly-by-wire" systems have been found to be very effective in military aircraft and missile systems.

Unfortunately, these systems are subject to power failures, short circuits or other damage to the wires, electromagnetic interference (EMI) from nearby wiring or electrical devices are potentially subject to destruction by electromagnetic pulses (EMP) from nuclear blasts or other sources. These is a particular need to overcome these problems in military aircraft, missiles and ship and in numerically controlled machine tools and where EMI and EMP pose serious problems.

Recently, considerable interest has developed in using optical fiber systems for remote control application and for transmitting information rapidly and accurately over long distances. Fiber optics have many of the advantages of the fly-by-wire systems while being impervious to electrical short circuits, EMI and EMP. Typical fiber optic control systems are disclosed by Sichling in U.S. Pat. No. 4,346,478 and Blackington in U.S. Pat. No. 4,313,226. While these systems are effective they are electrically complex and are not fully protected against system degradation caused by contamination of the optical interfaces.

In my copending U.S. patent application, Ser. No. 07/395,589, filed 8/18/89, I describe an improved fiber optic control system which is capable of fully proportional and easily reversible control. This system, for optimum utility, requires components which are compact, reliable, resistant to contamination and capable of performing varied functions. Prior devices for transducing light energy to a corresponding electrical signal tend to be single-purpose, heavy and complex, and to be subject to performance degradation by outside contaminants, such as moisture and dirt, penetrating between optical and optical-electrical components. Prior photo diode assemblies tend to produce a lower output voltage than required for many applications, requiring that a number of photo diode based conversion cell be wired in series.

Thus, there is a continuing need for improved devices for converting light energy to electrical energy in an accurate and reliable manner, which are resistant to outside contamination, EMI and EMP, and are adaptable to a number of different output requirements.

SUMMARY OF THE INVENTION

The above-noted problems, and others, are overcome by an electro-optic power cell which basically, comprises an output end of an optical fiber extending into a first housing through a wall to which the fiber is sealed, a lens in the first housing in abutting engagement with the output end of the fiber and is sealed thereto by optical epoxy of the like, a photo diode means in contact with the second end of the lens and means for directing the electrical output of the photo diode to any externally-engageable electrical connector in a second housing is fastened to the first housing. Even if contaminants were to enter, due to outside physical damage to the housing, effective operation will continue since the contract engagement of fiber end to lens and lens to photo diode is hermetically sealed to resist penetration of contaminants therebetween.

The lens is preferably cylindrical in configuration for lightest weight and has index of refraction and length chosen so that the light beam emanating from the optical fiber is expanded to just cover the active area of the photo diode for maximum efficiency.

Any suitable photo diode may be used. In many cases a single photo diode having a circular active area will be used to produce an electrical signal proportional to the incoming light signal will be preferred.

In some cases, however, a higher output voltage will be necessary or desirable. In the past, this requirement would be met by using a plurality of power cells, each fed by a separate optical fiber and having a separate photo diode, all connected in a series to increase the system output voltage. I have found that a single one of my power cells can accomplish the same result simply by fabricating the active area of the photo diode used in the power cell into pie-shaped segments and electrically interconnecting the segments in series. With two segments, the voltage will be substantially doubled; with eight segments, the voltage will be increased substantially by a factor of eight.

My single power cell can also be used to produce a reversible polarity output signal by again simply replacing the photo diode. In this case, the photo diode is separated into two segments. Different bandpass filters are placed over each half of the photo diode, generally one passing only long wavelength light and the other only short wavelength light. The leads from the two photo diode halves are wired to the output electrical connector with opposite polarity. Thus, when light of long wavelength passes through the optical fiber, an output electrical signal of one polarity will be produced, while when the light is changed to a short wavelength, the output electrical signal will have the opposite polarity. In the past, such reversible operations could only be accomplished through the use of two complete and separate power cells.

For some purposes, three or more independent segments, each covered with a bandpass filter passing a different wavelength of light, can be used to alternatively accomplish several functions. Each independent segment would have its own output electrical connector. Also, one of the two or more independent segments could be further divided into smaller series-connected segments as described above to increase the voltage of the independent segments.

Thus, it can be seen that my electro-optical power cell is reliable, efficient, light-weight, contamination resistant and versatile.

BRIEF DESCRIPTION OF THE DRAWING

Details of the invention, and of the preferred embodiments thereof, will be further understood upon reference to the drawing wherein:

FIG. 1 is an end elevation view of the power cell of this invention;

FIG. 2 is an axial section view through the power cell, taken on line 2—2 in FIG. 1;

FIG. 3 is a plan view of one embodiment of a photo diode useful in the power cell;

FIG. 4 is a side elevation view of the photo diode of FIG. 3;

FIG. 5 is a schematic side elevation view of an alternate embodiment of the photo diode assembly; and FIG. 6 is a section view of the assembly of FIG. 5, taken on line 6—6 in FIG. 5.

DETAILED DESCRIPTION OF THE INVENTION

Referring now to FIGS. 1 and 2, there is seen an elevation view and an axial section view, respectively, through the opto-electrical power cell 10 of this invention. An optical fiber 12 carrying a light signal enters a housing 14 and abuts lens 16. Fiber 12 is preferably sealed to housing 14 and to lens 16 to prevent, moisture, dirt or other contaminants entering the housing. Fiber 12 is sealed in contact with lens 16 by optical epoxy or the like to avoid moisture or other contaminants entering therebetween which would reduce the strength of the light signal entering lens 16. Housing 14 may be formed from any suitable material, such as structural plastics.

A photo diode 18 abuts and is sealed to the second end of lens 16 to receive light therefrom. Photo diode 18 may be of any conventional photo diode capable of receiving light energy and producing a corresponding electrical signal. Typical photo diodes suitable for use here include OSD-5, QD-50 and OSD1-5 available from CENTRONICS of England.

Lens 16 is sealed to the photo diode 18 to prevent contaminants such as moisture from entering therebetween. Lens 16 has a generally cylindrical shape and a length and index of refraction selected so as to expand the light beam emitted by optical fiber 12 to a diameter matching the active area of photo diode 18.

Electrical leads 20 conduct the electrical output of photo diode 18 to two conductive sleeves 22 in an insulating cylinder 24 which make up a conventional electrical socket 25 within housing 26. A coupling means 28 includes a shoulder 30 engaging housing 14 and threads 32 engaging threads 44 on housing 26 to lock the two housings together in a manner preventing entry of contaminants thereto. The electrical socket 25 can be fastened to a conventional male electrical receptacle by a coupler 34 having a shoulder 36, engaging a flange 38 on housing 26, and threads 40 to engage threads on the male connector (not shown).

Thus, power cell 10 is capable of transducing an entering light signal to an outgoing electrical light signal in an efficient, compact, contamination resistant manner and allows for disconnecting of the optical fiber from a replaceable component without disturbing the optical path. Any disturbing of the optical path is much more susceptible to attenuation than the electrical receptacle. Major loss in optical connectors is common and expected while no such loss occurs in electrical receptacle.

Any suitable photo diode may be used in the opto-electric power cell 10. In many cases, a single photo diode 18 as shown in FIGS. 1 and 2 will be preferred. However, in certain other cases the novel photo diode configurations detailed in FIGS. 3–6 will be preferred.

FIGS. 3 and 4 schematically illustrate a photo diode arrangement useful in power cell 10 where a higher output voltage is required, such as two to eight times the normal voltage produced by a typical photo diode.

For simplicity and clarity of illustration, photo diode 50 in this case is basically a modified standard "mesa" type photo diode having a base 52, a conducive layer 54, an "n" type layer 56 and a p-type diffused region on layer 58.

A plurality of transverse slots 60 are cut across photo diode substantially perpendicular to the upper surface and sufficiently deep to separate layers 54, 56, and 58 into eight discrete segments, with the cuts penetrating slightly into base 50 to assure that conductive layer 54 is fully separated. With eight segments, wired in series, the output voltage of photo diode 50 will be eight times that of the uncut diode. More or fewer cuts may be made, depending on the output voltage required. Typically, the cuts are made with a very thin rotating diamond saw blade, leaving kerfs having widths of about 0.004 inch.

Any suitable interconnection arrangement may be provided between segments to produce the desired series output. As schematically shown in FIGS. 3 and 4, eight jumpers 62 are provided, electrically interconnecting conductive layer 54 on one side of all but one slot 60 with p-type diffused layer 58 on the opposite side of each slot.

At some convenient point along the diode periphery, the jumper 62 is omitted and leads 64 and 66 are connected to conductive layer 54 and p-type layer 58 on opposite sides of that one slot 60. These leads 64 and 66 correspond to leads 20 in FIGS. 1 and 2.

Thus, a single power cell 10 can produce any of a number of different output voltages using the same basic photo diode, simply by installing a diode having a selected number of series connected segments. This simple arrangement compares very favorably with the cumbersome prior art requirement of using a number, such as eight, of complete power cells each with its own input fiber optics, all wired in series to produce the same voltage obtainable from a single, eight-segment, photo diode in a single power cell. The arrangement provides maximum optical efficiency in that the portion of the light beam not directed on the sensitive photodiode surface is minimized. The presently available methods requiring groups of photodiode for the same purpose cause gross inefficiency due to the required positioned arrangement.

Another preferred photo diode arrangement which permits reversible operation of a load, such as a motor, connected to the output of a single power cell 10, is schematically illustrated in FIGS. 5 and 6.

Here, two spaced photo diode halves generally similar to the segmented diode shown in FIGS. 3 and 4 are used, but without inter-segment jumpers. Each segment 70 and 72 has a pair of electrical output leads 74 and 76, respectively, adapted to connect with opposite polarity to an output connection in the same manner as leads 20 in FIG. 2. Thus, when light is absorbed by one of segments 70 and 72, a signal of corresponding magnitude is directed to the load, such as a motor which would operate in a first direction. Of course, if desired, each of segments 70 and 72 could be subdivided into further segments which would be wired in series sets to increase the output voltage in the manner shown in FIGS. 3 and 4.

Selectable light filtration is used to permit this reversible operation controlled by light from a single optical fiber 74. Light from optical fiber 74 enters lens 76 and is spread as shown by broken lines 78 to cover the active areas 79 of both segments 70 and 72. A filter 80 transmitting a first light band, such as a long wavelength light, is fitted over segment 70 while a filter 82 transmitting only a second light band, such as short wavelength light, is fitted over segment 72. Then, where 74, only photo diode segment 70 is actuated, sending a signal of a first polarity to the load through lens 74. When short wavelength light is transmitted through optical fiber 74, only photo diode segment 72 is activated, sending a signal of the opposite polarity to the electrical load through leads 76. Details of means for transmitting light of different wavelengths through an optical fiber are provided in my co-pending U.S. patent application Ser. No. 07/395,589.

The components illustrated in FIGS. 5 and 6 easily fit within the power cell 10 of FIGS. 1 and 2, permitting reversible operation of a load with a single, compact light-to-electrical-energy transducer in a single, sturdy, contamination resistant power cell.

While certain specific components, arrangements and dimensions were derailed in the above description of preferred embodiments, these may be varied, where suitable, with similar results. For example, the embodiment of FIGS. 5 and 6 could operate two different electrical devices as well as reversibly operate a single device. Other types of photo diodes, interconnected in other ways, may be used in the power cell of this invention.

Other variations, applications and ramifications of this invention will occur to those skilled in the art upon reading this disclosure. Those are intended to be included within the scope of this invention, as defined by the appended claims.

I claim:

1. An electro-optic power cell comprising:
a first housing adapted to be hermetically sealed;
an optical fiber having a first end penetrating through a wall of said first housing and sealed to said wall;
photo diode means in said first housing and spaced from said optical fiber first end;
lens means in said housing having a first end in contact with said first end of said optical fiber and a second end in contact with said photo diode, said lens adapted to expand a light beam exiting said fiber to a selected diameter at said photo diode;
electrical connector means adapted to receive an output signal from said photo diode and conduct it to electrical contacts external of said housing.

2. The power cell according to claim 1, wherein said electrical contacts are contained within a second housing which is fastened to said first housing in a manner substantially preventing contaminants from entering said first housing.

3. The power cell according to claim 1 wherein said first end of said optical fiber and photo diode means are sealed to said first and second end respectfully of said lens means by sealing means.

4. The power cell according to claim 3 wherein sealing means is optical epoxy.

5. The power cell according to claim 1 wherein: said photo diode means is divided into at least two segments; and further including jumper means electrically connecting said segments in series;
whereby the voltage of the output of said photo diode is increased in proportion to the number of photo diode segments.

6. The power cell according to claim 5, wherein said photo diode is divided by a plurality of substantially equally-spaced slots along planes substantially perpendicular to the active face of said photo diode, said slots passing substantially through the center of said active face.

7. The power cell according to claim 1 wherein;
said photos diode means is divided into at least two independent segments; and
further including optical filter means over said segments whereby light of different wavelengths is passed to different segments.

8. The power cell according to claim 7 wherein: there are two independent segments; and further including electrical leads from said segments connected to an electrical load with opposite polarity;
whereby said output of said power cell will have opposite polarity depending upon which photo diode is activated.

9. An electro-optic power cell comprising:
a first housing adapted to be hermetically sealed;
an optical fiber having a first end penetrating through a wall of said first housing and sealed to said wall;
photo diode means in said first housing and spaced from said optical fiber first end, said photo diode is divided into at least two independent segments whereby light of different wavelengths is passed to different segments;
lens means in said housing having a first end in contact with said first end of said optical fiber and a second end in contact with said photo diode, said lens adapted to expand a light beam exiting said fiber to a selected diameter at said photo diode;
electrical connector means adapted to receive an output signal from said photo diode and conduct it to electrical contacts external of said housing.

10. The power cell according to claim 9 wherein there are two independent segments, and further including electrical leads from said segments connected to an electrical load with opposite polarity;
whereby said output of said power cell will have opposite polarity depending upon which photo diode is activated.

* * * * *